(12) United States Patent
Tang et al.

(10) Patent No.: US 7,002,842 B2
(45) Date of Patent: Feb. 21, 2006

(54) FLOATING-BODY DYNAMIC RANDOM ACCESS MEMORY WITH PURGE LINE

(75) Inventors: Stephen H. Tang, Pleasanton, CA (US); Ali Keshavarzi, Portland, OR (US); Dinesh Somasekhar, Portland, OR (US); Fabrice Paillet, Hillsboro, OR (US); Muhammad M. Khellah, Lake Oswego, OR (US); Yibin Ye, Portland, OR (US); Shih-Lien Lu, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 110 days.

(21) Appl. No.: 10/721,184

(22) Filed: Nov. 26, 2003

(65) Prior Publication Data

US 2005/0111255 A1    May 26, 2005

(51) Int. Cl.
*G11C 11/34* (2006.01)
(52) U.S. Cl. ..................................... 365/177; 257/390
(58) Field of Classification Search ............... 365/177; 257/390; 711/131
See application file for complete search history.

(56) References Cited

U.S. PATENT DOCUMENTS

2004/0026749 A1 *  2/2004  Ohsawa ..................... 257/390
2004/0042256 A1 *  3/2004  Forbes ....................... 365/149
2004/0123037 A1 *  6/2004  Gomes et al. .............. 711/131
2005/0063224 A1 *  3/2005  Fazan et al. ................ 365/177

OTHER PUBLICATIONS

S. Okhonin et al.; A SOI Capacitor-less 1T-DRAM Concept; Oct. 2001; pp. 153-154; 2001 IEEE International SOI Conference.
Charles Kuo et al.; A Capacitorless Double-Gate DRAM Cell; Jun. 2002; pp. 345-347; IEEE Electron Device Letters, vol. 23, No. 6.
Takashi Ohsawa et al.; Memory Design Using a One-Transistor Gain Cell on SOI; Nov. 2002; pp. 1510-1522; IEEE Journal of Solid-State Circuits, vol. 37, No. 11.
Takashi Ohsawa et al.; A Memory Using One-Transistor Gain Cell on SOI (FBC) with Performance Suitable for Embedded DRAM's; 2003 Symposium on VLSI Circuits Digest of Technical Papers.
Takashi Ohsawa et al.; ISSCC 2002/ Session 9/ Dram and Ferroelectric Memories/ 9.1.
Wann et al., A Capacitorless DRAM Cell on SOI Substrate, 1993 IEEE, pp. 26.4.1-26.4.4.

* cited by examiner

Primary Examiner—Huan Hoang
(74) Attorney, Agent, or Firm—Fleshner & Kim LLP

(57) ABSTRACT

Embodiments relate to a Floating Body Dynamic Random Access Memory (FBDRAM). The FBDRAM utilizes a purge line to reset a FBDRAM cell, prior to writing data to the FBDRAM cell.

36 Claims, 7 Drawing Sheets

|  | SECOND CHANNEL INTERFACE | GATE (WL) | FIRST CHANNEL INTERFACE (BL) |
|---|---|---|---|
| HOLD | LOW | VERY LOW | VERY LOW, LOW, OR HIGH |
| WRITE LOGICAL 0 | LOW | HIGH | VERY LOW |
| WRITE LOGICAL 1 | LOW | HIGH | HIGH |

*FIG. 4*

| | SECOND CHANNEL INTERFACE (PURGE LINE) | GATE (WORD LINE) | FIRST CHANNEL INTERFACE (BIT LINE) |
|---|---|---|---|
| HOLD | LOW | LOW | LOW OR HIGH |
| PURGE | VERY LOW | VERY LOW | LOW |
| WRITE 0 | LOW | HIGH | LOW |
| WRITE 1 | LOW | HIGH | HIGH |

*FIG. 7*

FLOATING-BODY DYNAMIC RANDOM ACCESS MEMORY WITH PURGE LINE

BACKGROUND OF THE INVENTION

1. Field of the Invention

The field of invention generally relates to electronics.

2. Background of the Related Art

Electronics are very important to the lives of many people. In fact, electronics are present in almost all electrical devices (e.g. radios, televisions, toasters, and computers). It may be desirable for electronics to be designed as small as possible. Also, it may be desirable for electronics to operate as fast as possible. In fact, in some circumstances, electronics will operate faster when they are made smaller. Smaller devices may consume less power. Electronics that consume less power may also generate less heat. Electronics that generate less heat may operate at faster speeds. The speed of a electronic device may be a critical attribute governing its usefulness. For example, a computer which operates at a fast speed may be able to perform many different types of tasks (e.g. displaying moving video, making complex computations, and communicating with other devices) which a relatively slow computer may not be able to perform.

BRIEF DESCRIPTION OF THE DRAWINGS

FIG. 4 is an exemplary table illustrating voltages during operation of a memory cell.

FIG. 7 is an exemplary table illustrating voltages applied during operation of a memory cell.

DETAILED DESCRIPTION OF PREFERRED EMBODIMENTS

Electrical hardware (e.g. a computer) may include many electrical devices. In fact, a computer may include millions of electrical devices (e.g. transistors, resistors, and capacitors). These electrical devices may work together in order for hardware to operate correctly. Accordingly, electrical devices of hardware may be electrically coupled together. This coupling may be either direct coupling (e.g. direct electrical connection) or indirect coupling (e.g. electrical communication through a series of components).

Figure 1:
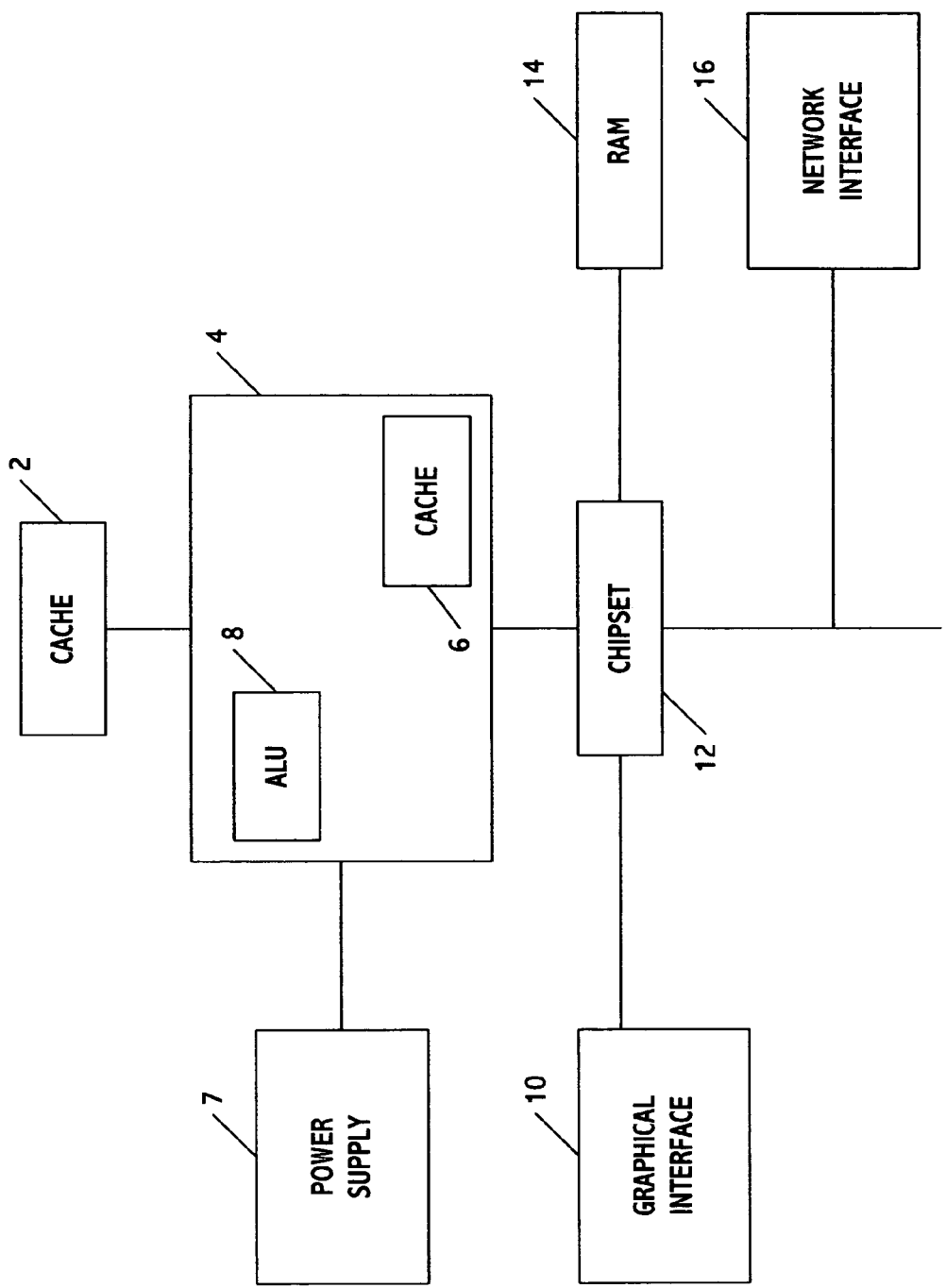
FIG. 1 is an exemplary global diagram of a portion of a computer.

FIG. 1 is an exemplary global illustration of a computer. The computer may include a processor 4, which acts as a brain of the computer. Processor 4 may be formed on a die. Processor 4 may include an Arithmetic Logic Unit (ALU) 8 and may be included on the same die as processor 4. ALU 8 may be able to perform continuous calculations in order for processor 4 to operate. Processor 4 may include cache memory 6 which may be for temporarily storing information. Cache memory 6 may be included on the same die as processor 4. Information stored in cache memory 6 may be readily available to ALU 8 for performing calculations. A computer may also include an external cache memory 2 to supplement internal cache memory 6. Power supply 7 may be provided to supply energy to processor 4 and other components of a computer. A computer may include a chip set 12 coupled to processor 4. Chip set 12 may intermediately couple processor 4 to other components of the computer (e.g. graphical interface 10, Random Access Memory (RAM) 14, and/or a network interface 16). One exemplary purpose of chip set 12 is to manage communication between processor 4 and these other components. For example, graphical interface 10, RAM 14, and/or network interface 16 may be coupled to chip set 12.

Figure 2:
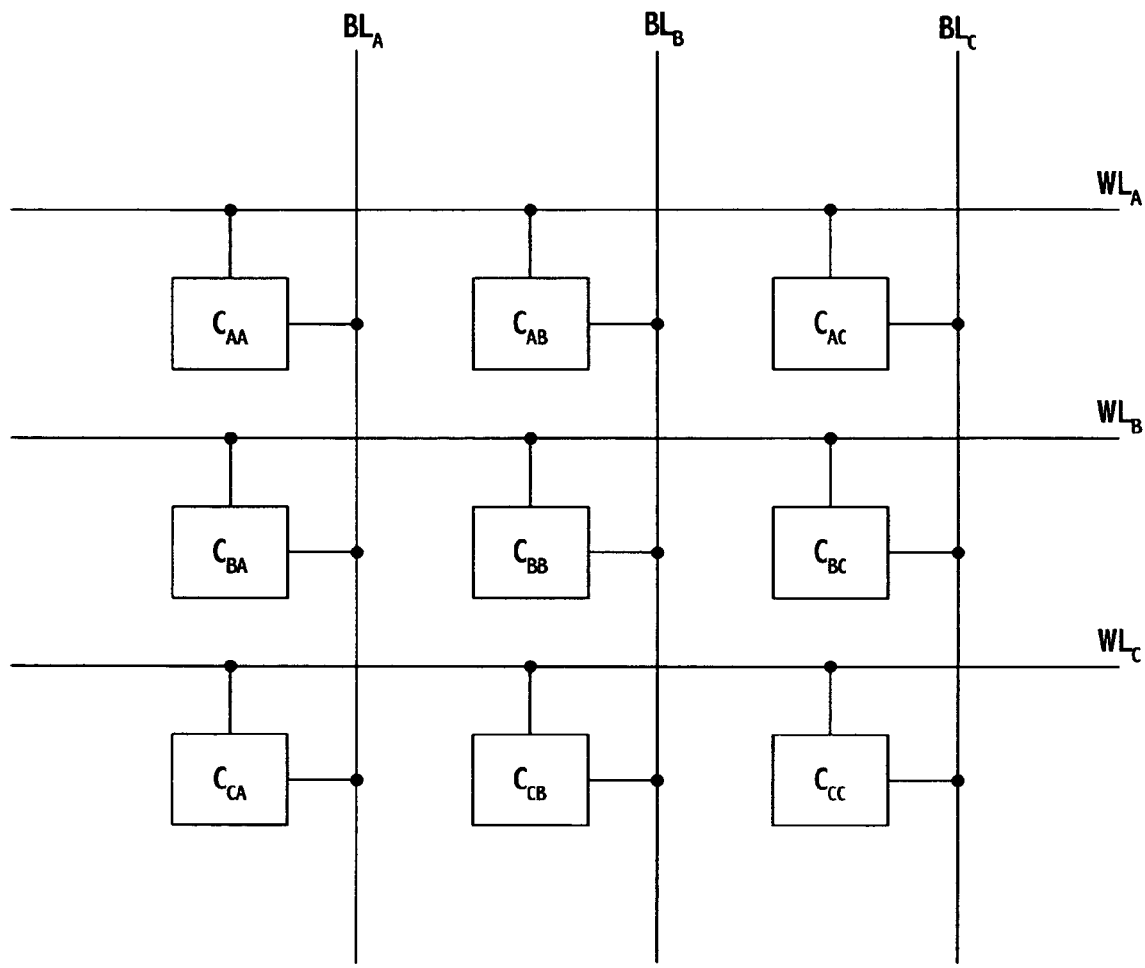
FIG. 2 is an exemplary diagram illustrating a plurality of memory cells each coupled to a bit line and a word line.

FIG. 2 is an exemplary diagram illustrating a plurality of memory cells ($C_{AA}$, $C_{AB}$, $C_{AC}$, $C_{BA}$, $C_{BB}$, $C_{BC}$, $C_{CA}$, $C_{CB}$, and $C_{CC}$). Each memory cell may be coupled to a bit line ($BL_A$, $BL_B$, or $BL_C$) and a word line ($WL_A$, $WL_B$, or $WL_C$). Word lines ($WL_A$, $WL_B$, and $WL_C$) may be used to activate a given memory cell. Bit lines may be used to read or write information from a given memory cell. In the exemplary illustration of FIG. 2, word line $WL_A$ is used to activate cells $C_{AA}$, $C_{AB}$, and $C_{AC}$. Cells $C_{AA}$, $C_{AB}$, and $C_{AC}$ may be activated at the same time by word line $WL_A$. When cells $C_{AA}$, $C_{AB}$, or $C_{AC}$ are activated, data may be written to each of these cells through bit line $BL_A$, $BL_B$, or $BL_C$. Data stored in cells $C_{AA}$, $C_{AB}$, and $C_{AC}$ may constitute a "word", which may be activated by word line $WL_A$. A "word" may be defined as a multi-bit segment of data. Likewise, cells $C_{BA}$, $C_{BB}$, and $C_{BC}$ may be activated by word line $WL_B$. Data written to or read from cells $C_{BA}$, $C_{BB}$, and $C_{BC}$ may be communicated through bit lines $BL_A$, $BL_B$, and $BL_C$. In embodiments of the present invention, only one of word lines $WL_A$, $WL_B$, and $WL_C$ is activated at the same time, since bit lines $BL_A$, $BL_B$, and $BL_C$ are shared by the different sets of cells that constitute a word.

The memory cells illustrated in FIG. 2 may have one of several configurations. For example, the memory cell may be a six transistor Static Random Access Memory (SRAM) cell. Alternatively, a memory cell may be a one transistor, one capacitor Dynamic Random Access Memory (DRAM) cell. Further, in embodiments, each memory cell may be Floating Body Dynamic Random Access Memory (FB-DRAM) cell. One of ordinary skill in the art would appreciate that FIG. 2 merely illustrates an arbitrary number of cells in a matrix and that different dimension of such a matrix may be utilized with a corresponding number of bit lines and word lines.

Figure 3A:
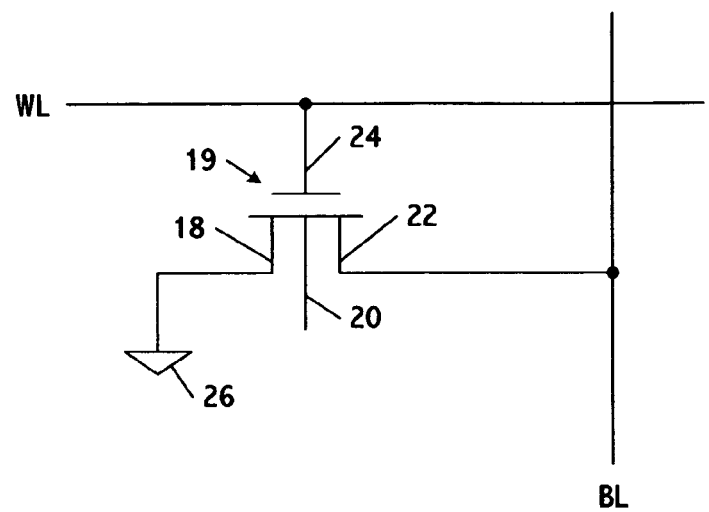
FIGS. 3A and 3B are exemplary illustrations of a memory cell coupled to a word line and a bit line.

FIG. 3A is an exemplary illustration of a memory cell which is a Floating Body Dynamic Random Access Memory (FBDRAM) cell. The cell may include a single transistor 19 connected to word line WL and bit line BL. Gate 24 of transistor 19 may be connected to word line WL. First channel interface 22 of transistor 19 may be connected to bit line BL. Second channel interface 18 of transistor 19 may be connected to ground 26. Body 20 of transistor 19 may be floating. Body 20 may be floating by being substantially electrically isolated from first channel interface 22, second channel interface 18, and gate 24. In embodiments of the present invention, first channel interface 22 may be either source or drain of transistor 19. Likewise, second channel interface 18 may be either source or drain of transistor 19. In embodiments of the present invention, transistor 19 is a MOSFET transistor.

A logical 1 may be written to transistor 19 by word line WL transmitting a high voltage to gate 24 of transistor 19 and bit line BL transmitting a high voltage to first channel interface 22 of transistor 19. By this combination of voltages applied to transistor 19, an electrical charge may be collected in the floating body 20 of transistor 19. To write a logical 0 to transistor 19, a high voltage may be applied to gate 24 through word line WL and a very low voltage (e.g. negative voltage) may be applied to first channel interface 22. When a very low voltage is applied to the channel interface 22, any charges in the floating body 20 are discharged.

Figure 3B:
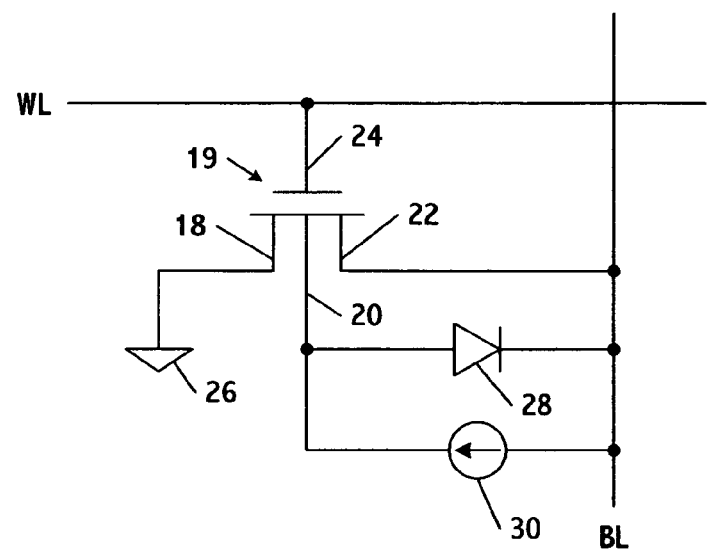

FIG. 3B is an exemplary illustration showing intrinsic features of transistor 19. Specifically, floating body 20 is illustrated as being connected to bit line BL through diode 28 and current source 30. Diode 28 and current source 30 are shown as being connected and in parallel. Diode 28 and current source 30 are not separate devices from transistor 19, but rather represent intrinsic properties of transistor 19. Although floating body 20 is theoretically electrically isolated from the other portions of transistor 19, practically, there is some electrical communication between floating body 20 and first channel interface 22.

Referring to FIG. 3B, when an appropriately high voltage is applied to first channel interface 22 and a high voltage is applied to gate 24, an impact ionization current flows through floating body 20. This current is represented by intrinsic current source 30. As a result of an impact ionization current, electron holes are created in the floating body 20, which effectively stores a charge in floating body 20. Likewise, when a sufficiently low voltage is applied to first channel interface 22 and a high voltage is applied to gate 24, intrinsic diode 28 becomes forward biased and electrons migrate from floating body 20 to bit line BL, removing electron holes from floating body 20. In other words, electric charge is dissipated from the floating body when a sufficiently low voltage is applied to first channel interface 22 and a high voltage is applied to gate 24. Accordingly, when a sufficiently low voltage is applied to first channel interface 22 through bit line BL, charge is removed from floating body 20 and data stored in floating body 20 may represent a logical 0. One of ordinary skill in the art would appreciate that diode 28 and current source 30 are intrinsic attributes of transistor 19 and are not separate semiconductor structures from transistor 19.

FIG. 4 is an exemplary table illustrating the necessary voltage levels for operation of a floating body dynamic random access memory cell. In order to write a logical 0 or write a logical 1, a low voltage must be applied to second channel interface 18. In exemplary illustrations FIGS. 3A and 3B, a low voltage applied to second channel interface 18 is 0 V by being connected to ground 26. In a hold operation, a very low voltage is applied to gate 24 while a low voltage is applied to first channel interface 22. In other words, during a hold operation, the very low voltage applied to gate 24 can effectuate electrical isolation of floating body 20, so that floating body 20 can hold charges representing either a logical 0 or a logical 1.

Although first channel interface 22 may ideally apply a low voltage during a hold operation, it is possible that a high voltage may be applied. As illustrated in FIG. 2, bit lines $BL_A$, $BL_B$, or $BL_C$ each may service a set of cells, wherein each set of cells is in a different word. For example, in FIG. 2, bit line $BL_A$ services cell $C_{AA}$, $C_{BA}$, and $C_{CA}$. During normal operation of a memory cell matrix, the bit line voltage may vary during the hold operation, because each bit line is servicing different words. As illustrated in exemplary FIG. 2, a given word line will service a plurality of cells in the same word. For example, word line $WL_A$ services cell $C_{AA}$, $C_{AB}$, and $C_{AC}$. Accordingly, cells $C_{AA}$, $C_{AB}$, and $C_{AC}$ will all have a very low voltage applied to their gates during a hold operation. In other words, an entire word will experience a hold operation at the same time. The very low voltage applied to the gates during a hold operation may insulate the charge (representing a logical 0 or logical 1) in the floating bodies from any voltage fluctuations on the bit lines.

As discussed above and as shown in exemplary FIG. 4, during the writing of a logical 0, the word line will apply a high voltage to gate 24 and a very low voltage on bit line BL to first channel interface 22. Likewise, during the writing of a logical 1 to transistor 19, the word line applies a high voltage to gate 24 and a high voltage on bit line BL to first channel interface 22.

In certain small-scale electronic devices, it is desirable for transistors to have very small dimensions. Accordingly, voltage tolerances on interfaces of a transistor may be relatively low. When there are relatively low tolerances, the voltage difference between a gate and each channel interface cannot exceed a threshold specific to that transistor. For example, if a very low voltage is applied to gate 24 and a high voltage is applied to a first channel interface 22, breakdown may occur and the transistor will not operate. If a transistor does not operate, it will not function in a memory device.

Large voltage differences which may cause breakdown are illustrated in exemplary FIG. 4. During a writing of a logical 0, a high voltage is applied on word line WL to gate 24 and very low voltage is applied on bit line BL to first channel interface 22. In this circumstance, in small-scale devices, breakdown may occur and transistor 19 may not operate properly because transistor 19 cannot tolerate the voltage difference between gate 24 (high voltage) and first channel interface 22 (very low voltage). Similarly, in a hold operation, a very low voltage is applied on the word line WL to gate 24 and the voltage level applied on bit line BL to first channel interface 22 may be either very low, low, or high. This fluctuation may be attributed to the possibility that the bit line BL services other memory cells in other words. When a write operation is implemented in another cell, a high voltage may be applied on bit line BL, which is consequently applied to first channel interface 22 of transistor 19 in the hold state. Accordingly, during a hold operation there may be a very low voltage applied to gate 24 and a high voltage applied to first channel interface 22. In small-scale electronic devices, this large voltage difference may cause breakdown and the transistor may not function.

Figure 5:
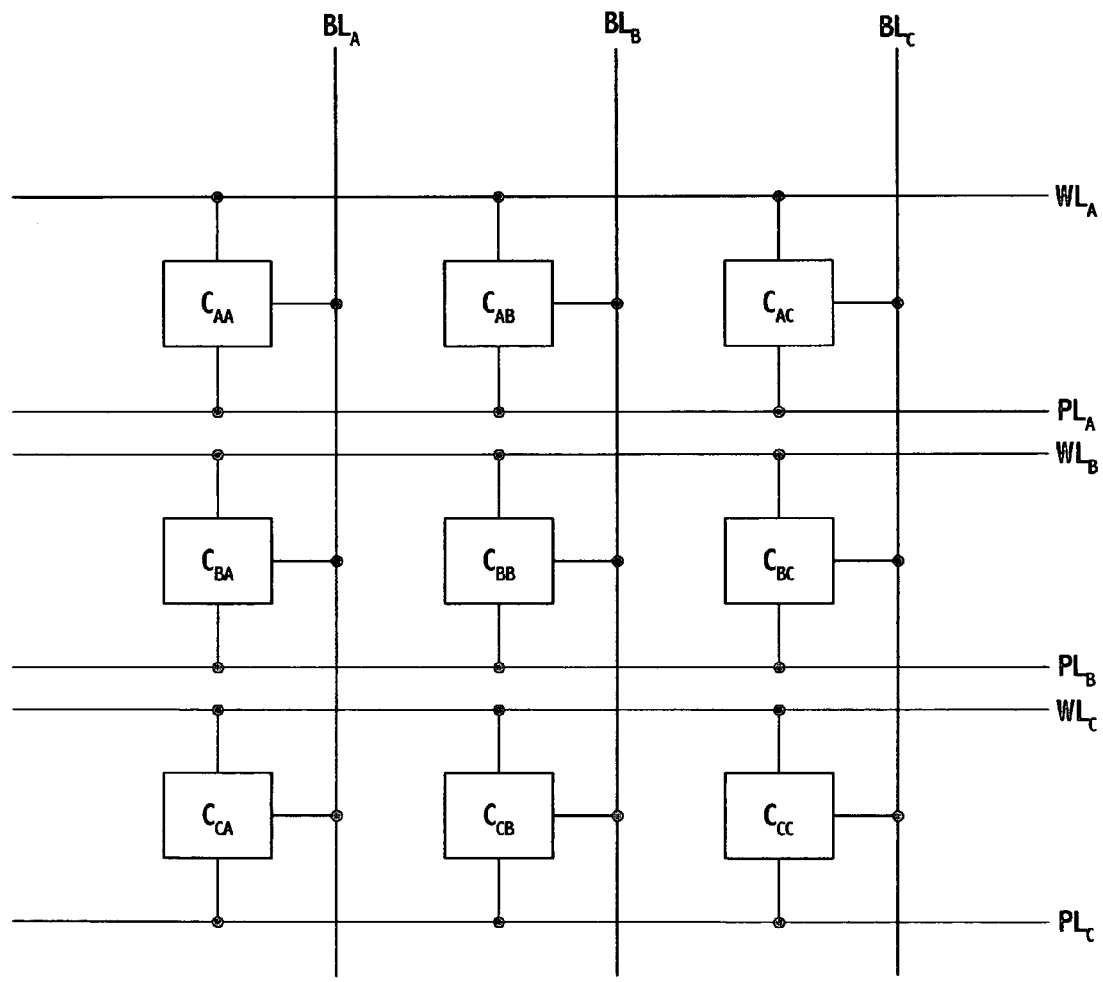
FIG. 5 is an exemplary illustration of a plurality of memory cells each coupled to a bit line, a word line, and a purge line.

FIG. 5 is an exemplary illustration of embodiments of the present invention. In embodiments, a matrix of memory cells include cells $C_{AA}$, $C_{AB}$, $C_{AC}$, $C_{BA}$, $C_{BB}$, $C_{BC}$, $C_{CA}$, $C_{CB}$, and $C_{CC}$. Each of these cells are connected to a bit line, a word line, and a purge line. For example, cell $C_{AA}$ is connected to word line $WL_A$, bit line $BL_A$ and purge line $PL_A$. Similar to FIG. 2, word line $WL_A$ services a word including cells $C_{AA}$, $C_{AB}$, and $C_{AC}$. Additionally, purge line $PL_A$ services this same word.

Figure 6A:
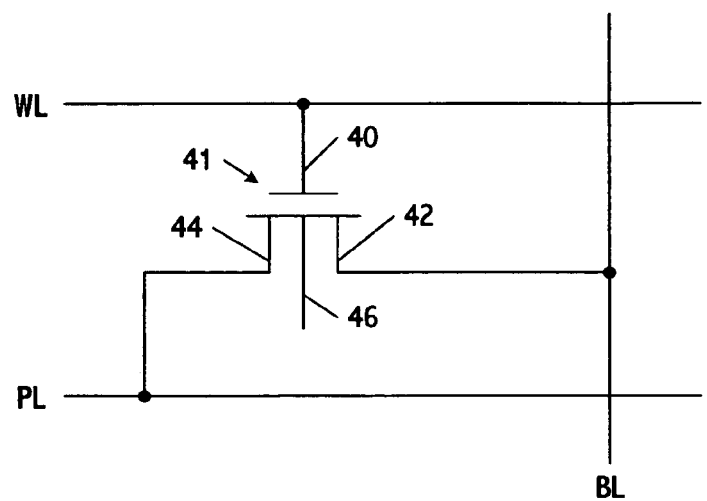
FIGS. 6A and 6B are exemplary illustrations of a memory cell coupled to a word line, a bit line, and a purge line.

FIG. 6A illustrates embodiments of the present invention including a floating body dynamic random access memory (FBDRAM) with a purge line. In these embodiments, word line WL is connected to gate 40. Bit line BL is connected to first channel interface 42. Purge line PL is connected to second channel interface 44. Floating body 46 is substantially electrically isolated from the other components of transistor 41. In embodiments of the present invention, transistor 41 is a MOSFET transistor.

Figure 6B:
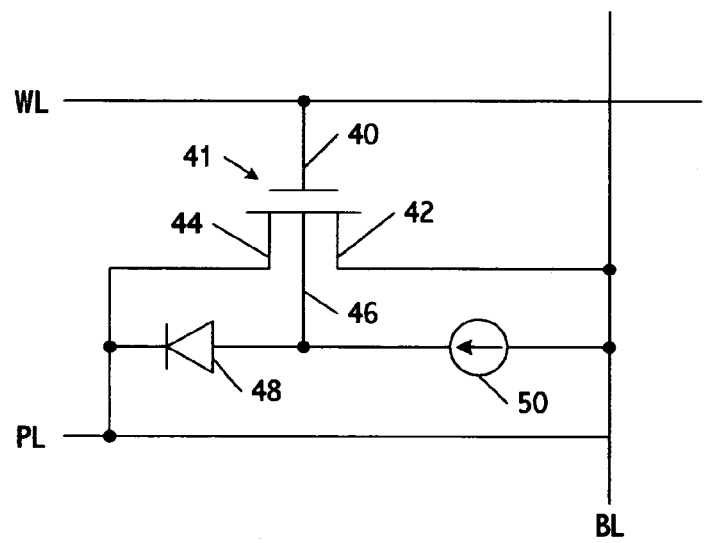

In operation of transistor 41 as a memory cell, according to embodiments of the present invention, every time data is written to transistor 41, two operations must occur. First, transistor 41 must be purged of any stored electrical charges. Second, transistor 41 must be programmed according to data transmitted on bit line BL. During the purge operation, a very low voltage is applied on purge line PL to transistor 41 by applying a very low voltage to second channel interface 44. As shown in FIG. 6B, intrinsic diode 48 becomes forward biased during the purge operation, consequently removing any electron holes that were previously in floating body 46. In embodiments of the present invention during the purge operation, a very low voltage may be applied to gate 40. By applying a very low voltage to gate 40, efficiency and power consumption may be improved. However, it is not absolutely necessary for a very low voltage to be applied to gate 40 in order for the purge operation to be successful.

During a write operation, a low voltage may be applied to second channel interface 44 through purge line PL and a high voltage may be applied on word line WL to gate 40. If a logical 0 is written to transistor 41, a low voltage may be applied on bit line BL to first channel interface 42. In embodiments, the low voltage applied on bit line BL to transistor 41 effectively maintains a zero charge state of the floating body 46 of transistor 41. Accordingly, after the purge operation, floating body 46 may store a charge representing a logical 0. By applying low voltage on bit line BL, this charge representing a logical 0 may be maintained.

During a write operation of a logical 1 to transistor 41, a high voltage is applied on bit line BL to first channel interface 42. When this high voltage is applied to first channel interface 42, an impact ionization current is applied to floating body 46, creating electron holes in the floating body and effectively storing a charge in floating body 46. The impact ionization current phenomenon is represented by intrinsic current source 50 in FIG. 6B. In embodiments, intrinsic diode 48 may only be forward-biased during the purge operation and operates only when a very low voltage is applied on purge line PL to second channel interface 44. Likewise, intrinsic current source 50 may only operate during the writing of a logical 1 when a high voltage is applied on the bit line BL to first channel interface 42. In embodiments, a high voltage may be applied to gate 40 during writing of a logical 1.

FIG. 7 is an exemplary table illustrating voltages applied during a hold operation, a purge operation, a write logical 0 operation, and a write logical 1 operation of a floating body dynamic random access memory cell with a purge line according to embodiments of the present invention. During a hold operation, second channel interface 44 and gate 40 receive a low voltage level (e.g. ground). During a purge operation, second channel interface 44 and gate 40 receive a very low voltage (e.g. a negative voltage). During a hold operation, first channel interface 42 may receive a low voltage or high voltage from bit line BL. This fluctuation of voltage over the bit line BL during a hold operation may be attributed to activity relating to another memory cell that shares bit line BL with transistor 41.

During a write operation, second channel interface 44 may receive a low voltage and gate 40 may receive a high voltage. During writing of a logical 0, first channel interface 42 may receive a low voltage. Conversely, during writing of a logical 1, first channel interface 42 may receive a high voltage. Accordingly, as shown in FIG. 7, at no point during a hold, purge, or write operation are there extreme voltage differences between any of the interfaces of the transistor. Accordingly, operation of a Floating Body Dynamic Random Access Memory FBDRAM can be accomplished with smaller scale devices that have lower tolerances.

In embodiments of the present invention a very low voltage is a negative voltage in a range of −0.5V to −2.5V. In embodiments, a high voltage is a positive voltage in a range of 0.5V to 2.5V. In embodiments, a low voltage is a ground voltage that is approximately 0V.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. An apparatus comprising:
   a transistor to store data, wherein:
   a gate of the transistor is configured to receive a first control signal;
   a first channel interface of the transistor is configured to receive a data signal; and
   a second channel interface of the transistor is configured to receive a second control signal, the data being stored in the transistor by resetting a floating body of the transistor and then writing the data to the floating body, the floating body being reset when the second control signal assumes a first value, the first value being lower than a second value which the second control signal assumes when the data is written into the floating body, and wherein the first channel interface is a drain and the second channel interface is a source of the transistor.

2. The apparatus of claim 1, wherein the apparatus is a memory device.

3. The apparatus of claim 2, wherein the memory device is a dynamic random access memory device.

4. The apparatus of claim 3, wherein the dynamic random access memory device is a floating body dynamic random access memory device.

5. The apparatus of claim 2, wherein a purge line is coupled to the second channel interface of the transistor.

6. The apparatus of claim 1, wherein:
   the first channel interface is a drain; and
   the second channel interface is a source.

7. The apparatus of claim 1, wherein:
   the first channel interface is a source; and
   the second channel interface is a drain.

8. The apparatus of claim 1, wherein a word line is coupled to the gate of the transistor.

9. The apparatus of claim 1, wherein a bit line is coupled to the first channel interface of the transistor.

10. The apparatus of claim 1, wherein the first value corresponds to a first voltage level at the second channel interface of the transistor.

11. The apparatus of claim 10, wherein the first voltage level is part of the second control signal.

12. The apparatus of claim 10, wherein the first voltage level is in a range of −0.5V to −2.5V.

13. The apparatus of claim 10, wherein said resetting the floating body of the transistor comprises receiving a second voltage level at the gate of the transistor.

14. The apparatus of claim 13, wherein the second voltage level is part of the first control signal.

15. The apparatus of claim 13, wherein the second voltage level is in a range of −0.5V to −2.5V.

16. The apparatus of claim 15, wherein the first and second voltage levels are a same voltage level.

17. The apparatus of claim 13, wherein the first voltage level and the second voltage level are received at the transistor overlapping in time.

18. The apparatus of claim 1, wherein said writing data to the floating body of the transistor comprises receiving a third voltage level at the first channel interface of the transistor.

19. The apparatus of claim 18, wherein the third voltage level is part of the data signal.

20. The apparatus of claim 18, wherein:
the third voltage level is approximately 0V if data written to the transistor represents a logical 0; and
the third voltage level is in a range of 0.5V to 2.5V if data written to the transistor represents a logical 1.

21. The apparatus of claim 18, wherein said writing data to the floating body of the transistor comprises:
receiving a fourth voltage level at the second channel interface of the transistor; and
receiving a fifth voltage level at the gate of the transistor.

22. The apparatus of claim 21, wherein:
the fourth voltage level is part of the second control signal; and
the fifth voltage level is part of the first control signal.

23. The apparatus of claim 21, wherein the third voltage level, the fourth voltage level, and the fifth voltage level are received at the transistor overlapping in time.

24. The apparatus of claim 21, wherein the fourth voltage level is approximately −0.5V to 0V.

25. The apparatus of claim 21, wherein the fifth voltage level is in a range of 0.5V to 2.5V.

26. A method comprising:
resetting a floating body of the transistor with a first set of control signals overlapping in time; and
selectively writing data to the floating body of the transistor with a second set of control signals and a data signal overlapping in time, the first set of control signals and the second set of control signals being received at a gate of the transistor and a source of the transistor, and the data signal is received at a drain of the transistor,
the first set of control signals including a purge signal coupled to the source of the transistor, the purge signal having a first value lower than a second value which is coupled to the source when the data is selectively written to the floating body of the transistor.

27. A system comprising:
a die comprising a processor; and
an off-die component in communication with the processor;
wherein the processor comprises a transistor to store data, wherein:
a gate of the transistor is configured to receive a first control signal;
a first channel interface of the transistor is configured to receive a data signal; and
a second channel interface of the transistor is configured to receive a second control signal, the data being stored in the transistor by resetting a floating body of the transistor and then writing the data to the floating body, the floating body being reset when the second control signal assumes a first value, the first value being lower than a second value which the second control signal assumes when the data is written into the floating body, and wherein the first channel interface is a drain and the second channel interface is a source of the transistor.

28. The system of claim 27, wherein the off-die component is at least one of a cache memory, a chip set, and a graphical interface.

29. A memory cell, comprising:
a transistor including:
(a) a gate coupled to a word line,
(b) a drain coupled to a bit line,
(c) a source coupled to a purge line, and
(d) a floating body between the source and drain,
the purge line assuming a first value during a reset operation and a second value when data is stored in the floating body during a write operation, the first value being lower than the second value.

30. The memory cell of claim 29, wherein the word line assumes the first value and the bit line assumes the second value during the reset operation.

31. The memory cell of claim 29, wherein the first value lies in a negative voltage range.

32. The memory cell of claim 31, wherein the negative voltage range includes −0.5V to −2.5V.

33. The memory cell of claim 29, wherein the word line and purge line assume the second value and the bit line assumes the second value or a greater value during a hold operation.

34. The memory cell of claim 29, wherein the bit line assumes the second value and the word line assumes a third value during the reset operation, the first value and the third value both included in a negative voltage range.

35. The memory cell of claim 34, wherein the negative voltage range includes −0.5V to −2.5V.

36. The memory cell of claim 35, wherein the first and third values are a same value.

* * * * *